US007771903B2

(12) United States Patent
Zhang et al.

(10) Patent No.: US 7,771,903 B2
(45) Date of Patent: Aug. 10, 2010

(54) PHOTOLITHOGRAPHY WITH OPTICAL MASKS HAVING MORE TRANSPARENT FEATURES SURROUNDED BY LESS TRANSPARENT FEATURES

(75) Inventors: Fenghong Zhang, Sunnyvale, CA (US); Xinyu Zhang, Palo Alto, CA (US); Jian Xu, San Jose, CA (US)

(73) Assignee: Promos Technologies Pte. Ltd., Singapore (SG)

( * ) Notice: Subject to any disclaimer, the term of this patent is extended or adjusted under 35 U.S.C. 154(b) by 276 days.

(21) Appl. No.: 12/128,456

(22) Filed: May 28, 2008

(65) Prior Publication Data

US 2009/0297956 A1 Dec. 3, 2009

(51) Int. Cl.
*G03F 1/00* (2006.01)
*G03C 5/00* (2006.01)
(52) U.S. Cl. .......................................... 430/5; 430/311
(58) Field of Classification Search .................. 430/5, 430/311, 312, 313, 394; 716/19, 20, 21
See application file for complete search history.

(56) References Cited

U.S. PATENT DOCUMENTS

| 5,288,569 | A | 2/1994 | Lin |
| 6,884,551 | B2 | 4/2005 | Fritze et al. |
| 7,172,840 | B2 | 2/2007 | Chen |

OTHER PUBLICATIONS

Wolf, Stanley; Tauber, Richard N. "Silicon Processing for the VLSI Era—vol. 1: Process Technology—Chapter 13: Lithography II: Optical Aligner and Photomasks" Second Edition, Lattice Press, Sunset Beach, California, 2000, pp. 545-582.

*Primary Examiner*—Stephen Rosasco
(74) *Attorney, Agent, or Firm*—Haynes and Boone, LLP; Michael Shenker

(57) ABSTRACT

In photolithographic exposure, a feature (144) of an optical mask is projected onto a dark area (160). The light intensity inside the dark area is reduced by providing a non-printable clear cutout (410) inside the feature. The optical mask has the same optical pathlength outside the feature (144) adjacent to the entire outer boundary of the feature as at the cutout, the optical pathlength being measured along the optical mask's thickness.

29 Claims, 16 Drawing Sheets

PHOTOLITHOGRAPHY WITH OPTICAL MASKS HAVING MORE TRANSPARENT FEATURES SURROUNDED BY LESS TRANSPARENT FEATURES

BACKGROUND OF THE INVENTION

The present invention relates to photolithography.

In a photolithographic exposure process, a wafer surface is coated with photoresist, and the photoresist is illuminated by light passing through an optical mask having a pattern of clear and opaque features. These features define an illumination pattern of light and dark areas on the photoresist surface. At the light areas, the photoresist becomes more soluble (if positive) or less soluble (if negative) in a developer solution. The wafer is then placed into the developer solution to dissolve the soluble portions of the photoresist. The remaining photoresist provides a photoresist mask used in subsequent processing (e.g. etching, deposition, ion implantation, etc.).

In non-contact exposure, the optical mask is held at a distance from the photoresist surface to avoid mask damage. Due to bending of light rays, the pattern of light and dark areas in the photoresist does not always correspond to the pattern of clear and opaque features of the optical mask. The areas corresponding to the opaque features can thus be undesirably illuminated, reducing the contrast between the dark and light areas and/or reducing the dark areas' sizes.

SUMMARY

This section summarizes some features of the invention. Other features may be described in the subsequent sections. The invention is defined by the appended claims, which are incorporated into this section by reference.

The inventors have discovered that if an opaque feature is small, the corresponding area of the photoresist can be dark at the edges but fairly light inside. This may happen, for example, in a projection system using the light wavelength of 193 nm if the opaque feature is sized to be projected onto a rectangular area of about 300 nm×250 nm. An optical mask may include an array of such opaque features, with the corresponding rectangular areas being spaced from each other by about 900 nm. The rectangular areas includes center portions that receive too much light. If the photoresist is positive for example, then the photoresist is eroded at the center portions when the photoresist is developed.

The inventors have also discovered that the center portions of the rectangular areas can be protected if the corresponding opaque features are modified with clear cutouts at the center. Thus, the mask is made clear both around and inside the opaque features. The clear features inside the opaque features are not printed, i.e. are projected onto dark areas of the photoresist, as the size of these clear features cannot be resolved by the projection system. The clear features inside the opaque features have the same vertical optical pathlength (i.e. the pathlength in the vertical direction, along the optical mask's thickness) as the clear features surrounding and bordering on the opaque features, and in this sense the invention is the opposite of the phase shift technology described in U.S. Pat. No. 7,172,840 B2 issued Feb. 6, 2007 to Chen (incorporated herein by reference)

The invention is not limited to the embodiments and advantages described above except as defined by the appended claims. .

DESCRIPTION OF SOME EMBODIMENTS

The embodiments described in this section illustrate but do not limit the invention. The invention is defined by the appended claims.

Figure 1:
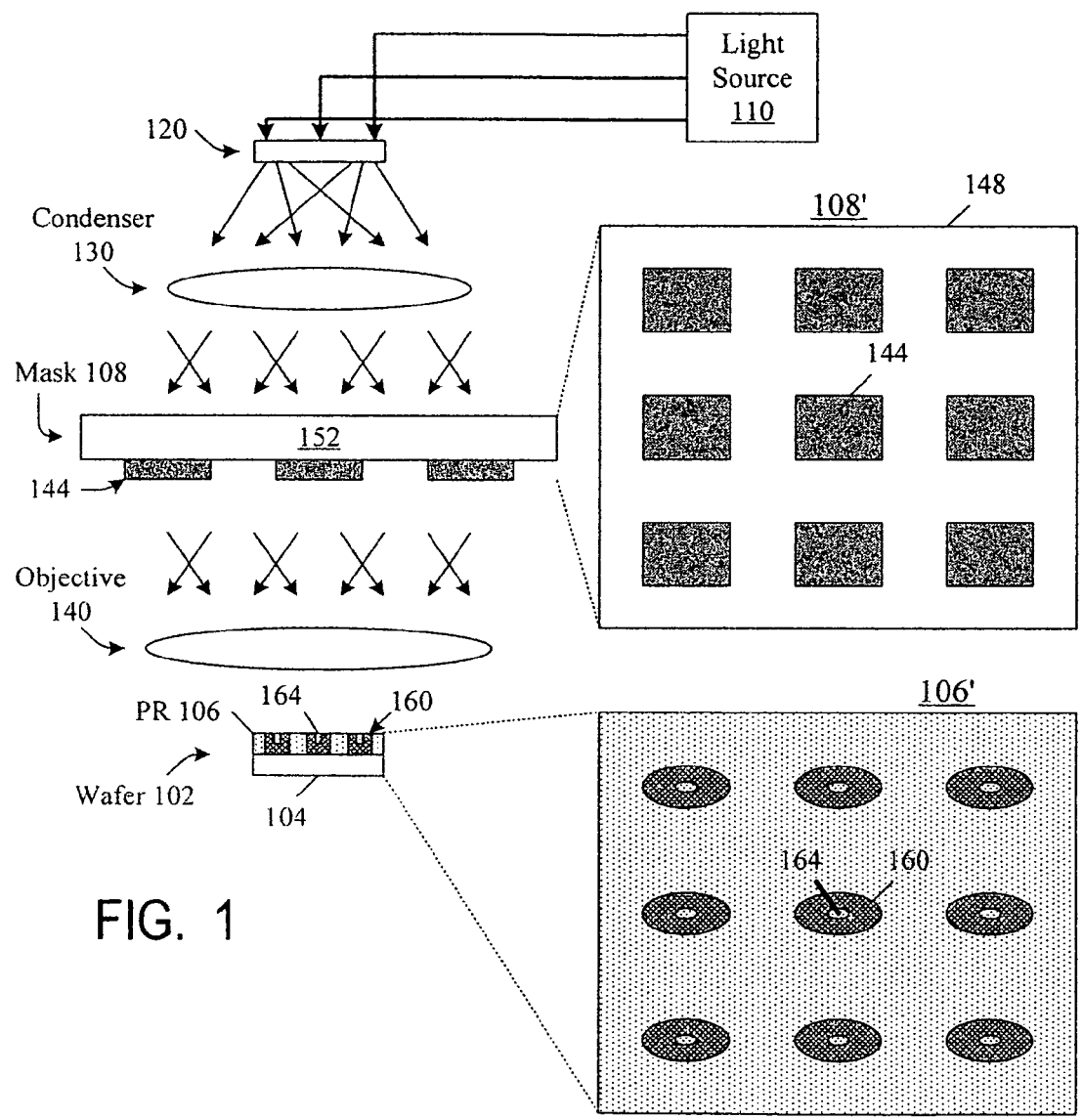
FIG. 1 includes a side view of a photolithographic exposure system and side and plan views of an optical mask to illustrate some embodiments of the present invention.

FIG. 1 is a side view of an exemplary photolithographic exposure system used to form an illumination pattern on a wafer 102 including a substrate 104 covered with a photoresist layer 106. The system is projection type, with optical mask 108 being at a distance from the wafer. Coherent light emitted by a laser light source 110 passes through an illumination pupil 120 positioned in the focal plane of a condenser lens 130. The light emerging from pupil 120 is coherent or partially coherent. Condenser lens 130 concentrates the light on the mask 108. Objective lens 140 images the pattern of mask 108 onto the photoresist 106. Objective 140 may also shrink the mask pattern (by a factor S of four or five for example). A suitable exposure system is type ASML XT 1250 (Trademark) available from ASML Holding N.V., De Run 6501, 5504 DR Veldhoven, The Netherlands, with the light wavelength $\lambda=193$ nm. The invention is not limited to a particular exposure system or wavelength.

Mask 108 is shown in plan view at 108'. The view 108' may represent only a portion of the mask, and this portion may be projected onto only a portion of wafer 102, as is done in some stepper-type exposure systems. The mask 108 contains an array of opaque features 144 surrounded by clear feature 148 bordering on each opaque feature 144. The clear feature 148 has a uniform vertical optical pathlength (the pathlength along the optical mask's thickness). This type of mask can be provided by a clear substrate 152 of a uniform thickness and composition (e.g. quartz), with features 144 formed on substrate 152 using an opaque material (e.g. chrome) or a partially transparent material (e.g. MoSi). Features 144 thus can be partially opaque, but will be called "opaque" in the sense that they are more opaque to light from source 110 than the clear feature 148.

Figure 2:
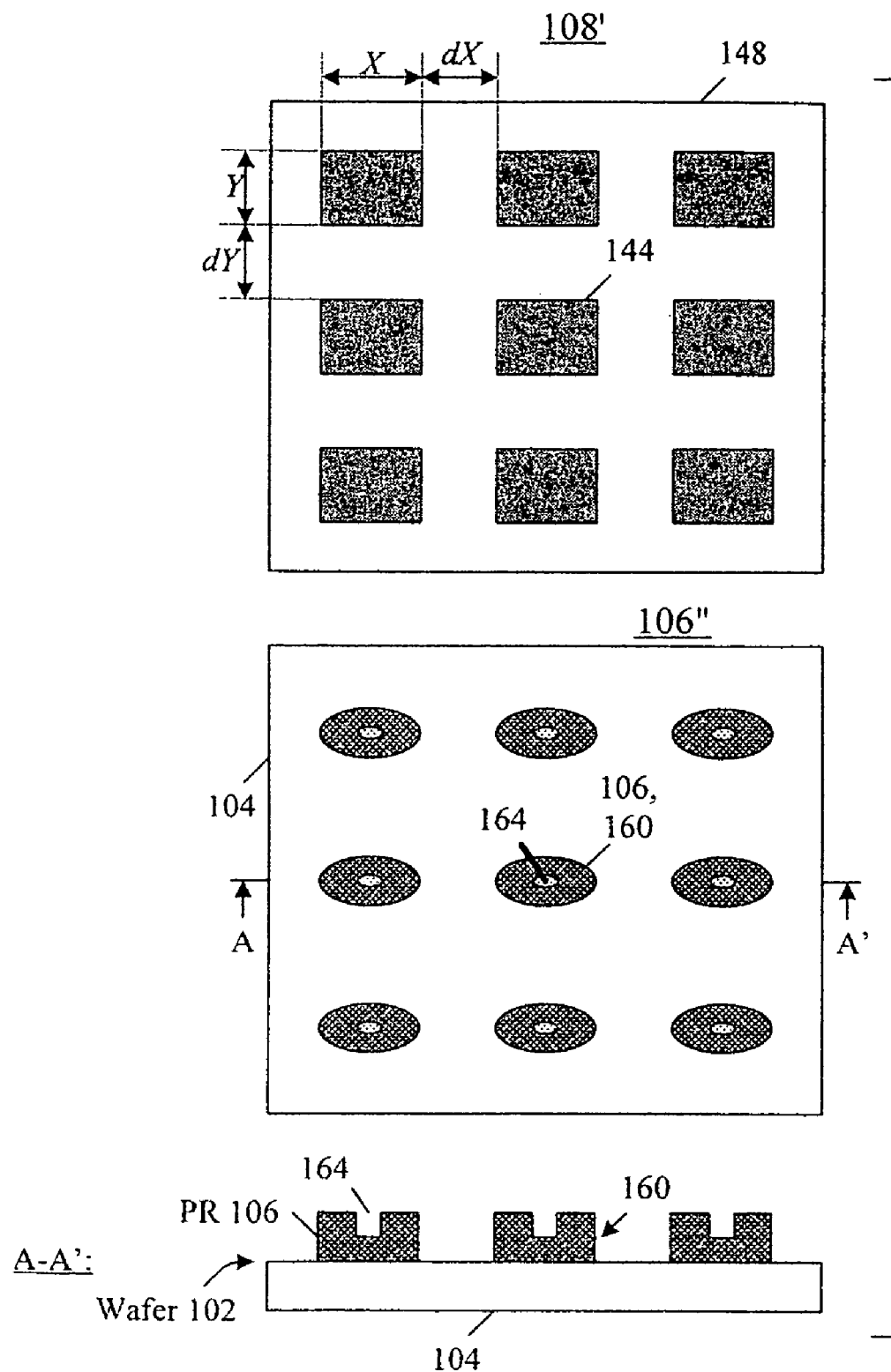
FIG. 2 includes a plan view of an optical mask and plan and cross sectional views of a wafer to illustrate some embodiments of the present invention.

The corresponding pattern of light and dark areas in photoresist 106 is shown in plan view at 106'. The view 106' is sized to the dimensions of view 108' (i.e. the view 106' is enlarged by the shrinkage factor S if S is not 1). Each opaque feature 144 is projected onto a respective photoresist area 160. The inventors have discovered that depending on the dimensions of the features 144, a photoresist area 160 may be not all dark but may contain a light area 164 at the center. FIG. 2 includes the mask view 108' and also shows the photoresist pattern in a positive photoresist when the photoresist has been developed. The photoresist pattern is shown in plan view at 106" and is also shown in a cross section A-A' passing through the middle of areas 160. At each area 160, the photoresist is thicker at the periphery (i.e. near the edges of area 160) than in the internal area 164. Photoresist erosion in areas 164 in the developer solution may undesirably affect subsequent processing.

In the mask view 108' of FIG. 2, the symbols X and Y denote dimensions of each opaque feature 144, and the symbols dX and dY denote the spacings, in the X and Y directions respectively, between the adjacent features 144 in an array of such features. The light areas 164 may be formed, for example, with the wavelength λ=193 nm when each of X and Y is about 180~300 nm, and each of dX and dY is about 350~900 nm. (The corresponding dimensions on the wafer can be obtained by division by the shrinkage factor S). For any wavelength λ, it is believed that the light areas 164 may form if at least one of X and Y is at least 0.75λ (0.75λ=144.75 nm for λ=193 nm) and at least one of dX, dY is at least λ/3 (64.33 nm for λ=193 nm).

Figure 3:
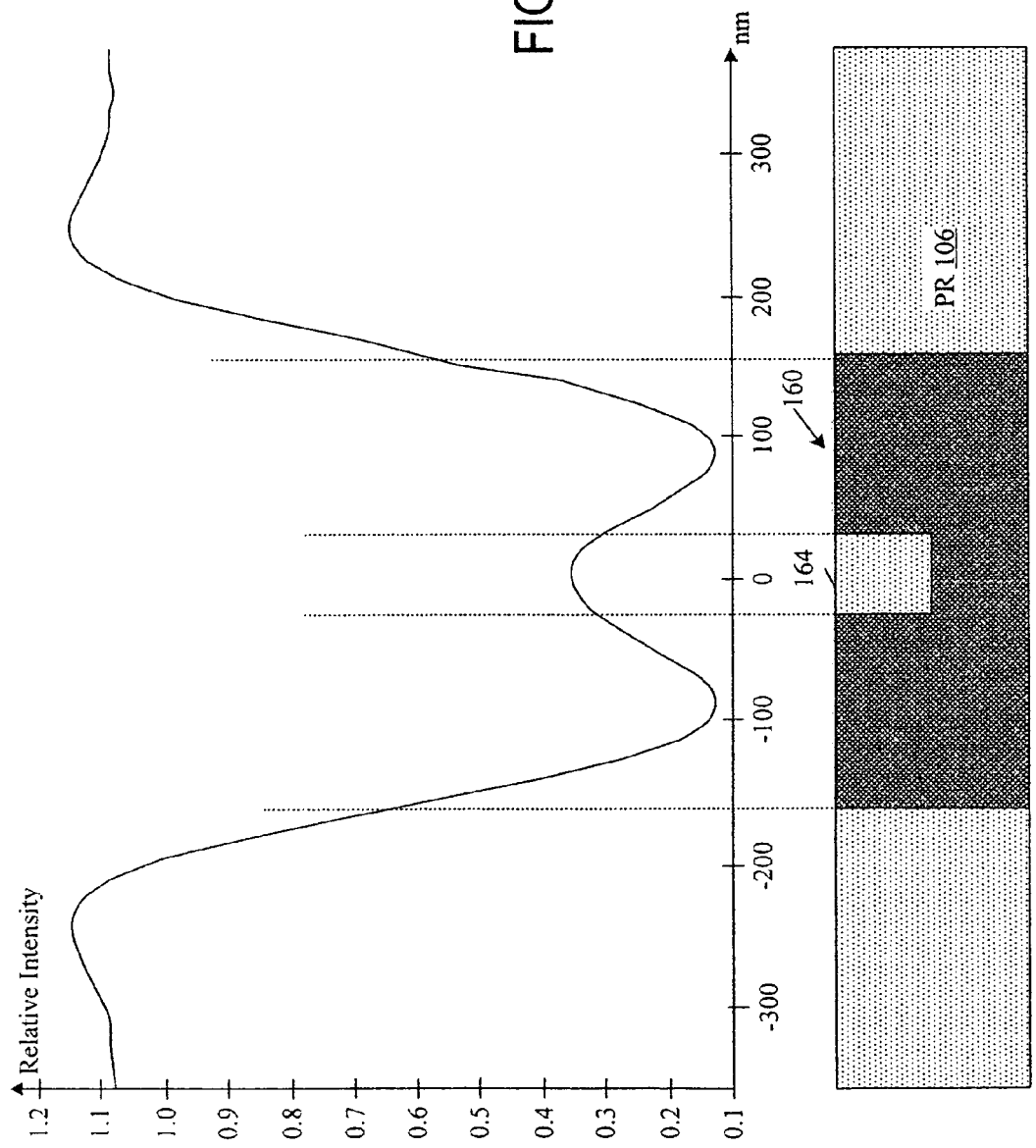
FIG. 3 is a graph of light intensity at different positions on photoresist to illustrate some embodiments of the present invention.

FIG. 3 illustrates the light intensity profile (obtained by simulation) for a single area 160. The light intensity is shown as the relative intensity which is the ratio of the absolute intensity to some reference intensity. The reference intensity may be the intensity in a clear a clear area far from any opaque areas. The light intensity is shown as a function of position in a cross section passing through the center of area 160. The light intensity has a local peak in the middle (at position 0), corresponding to the light area 164.

Figure 4:
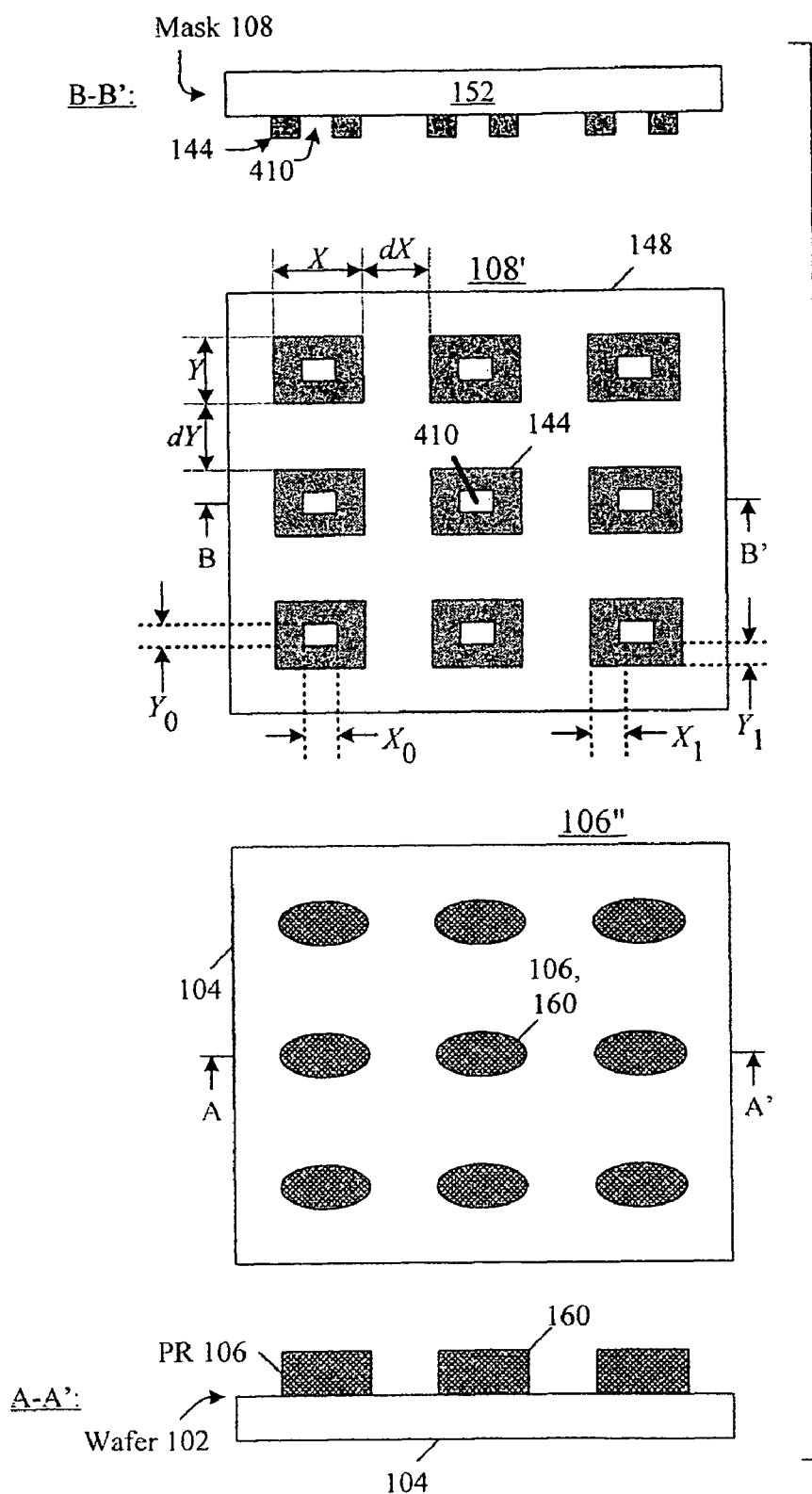
FIG. 4 includes plan and cross sectional views of an optical mask and a wafer to illustrate some embodiments of the present invention.

The light intensity in areas 164 can be reduced without changing the dimensions of opaque features 144 if the opaque features are provided with clear cutouts 410, as shown in FIG. 4 which illustrates: (a) the plan view 108' of the optical mask, (b) the mask's vertical cross section B-B' through the middle of cutouts 410, (c) the wafer's top view 106" after the resist has been developed, and (d) the wafer's vertical cross section A-A' through the middle of areas 160 after the resist has been developed. Mask 108 has the same, uniform vertical optical pathlength throughout the clear features 410, 148 inside and around the features 144. The uniform optical pathlength can be achieved by forming the mask as a substrate 152 of uniform thickness and composition (e.g. quartz), with the opaque features (i.e. the opaque portions of features 144) formed using a suitable opaque material (e.g. chrome) or partially opaque material (e.g. MoSi). Alternatively, the opaque features may be formed of the same material as the substrate 152, and they can be integral with the substrate (i.e. one continuous piece). The cutouts 410 are not resolved by the exposure system, so the entire projections 160 of features 144 are dark. The resist erosion in the middle of areas 160 is therefore eliminated, as shown in the cross sectional view A-A' of wafer 102 at the bottom of FIG. 4.

Figure 5:
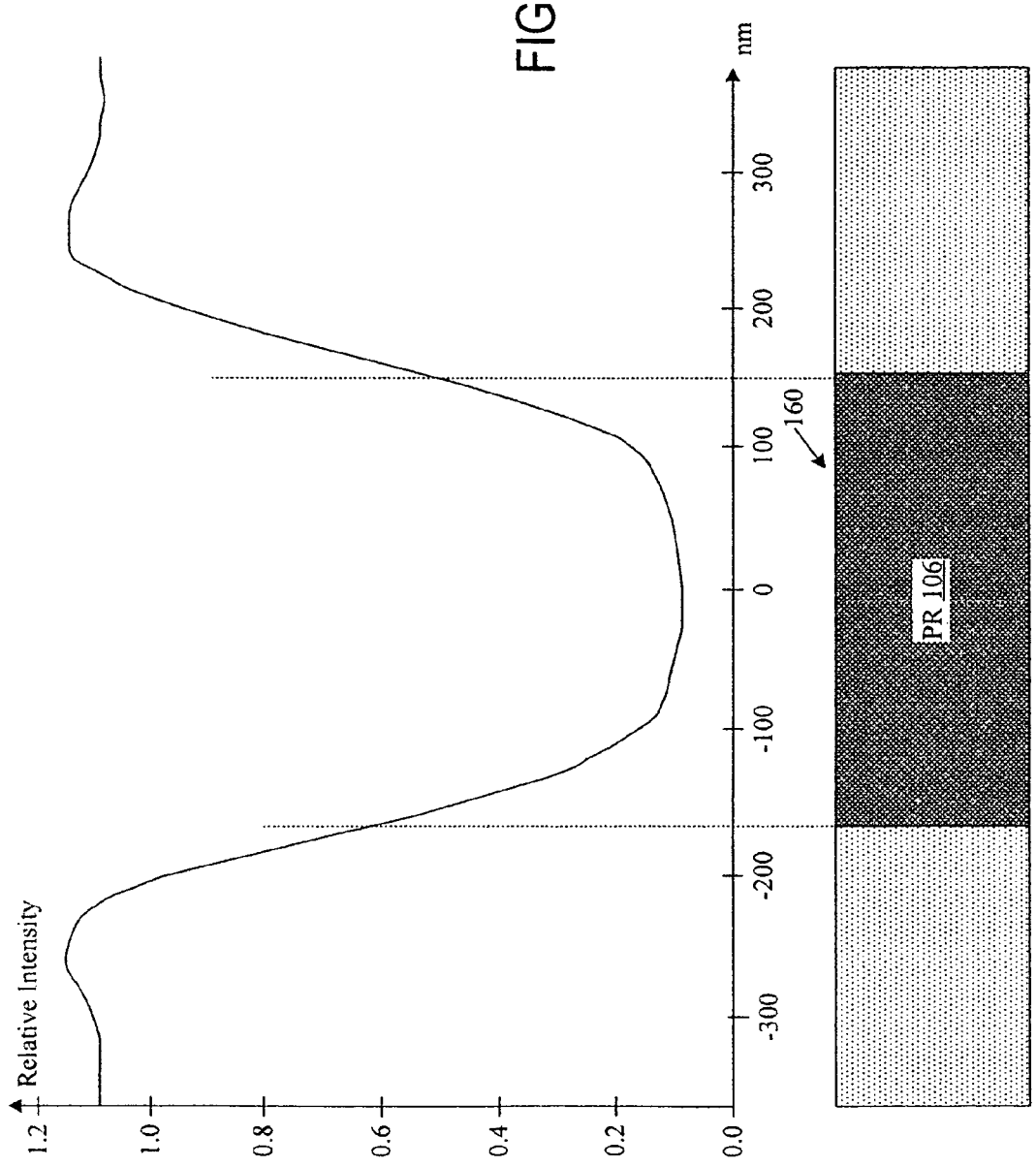
FIGS. 5-14 are graphs of light intensity at different positions on photoresist to illustrate some embodiments of the present invention.

FIG. 5 shows the light intensity profile (obtained by simulation), using the same view and dimensions as in FIG. 3. Some embodiments use the same exposure system as in FIG. 1, but other exposure systems can also be used.

In some embodiments, the wavelength λ=193 nm, the X×Y dimensions are 250×300 nm, the dX and dY dimensions are three times the respective X and Y dimensions, and each cutout 410 is a square of the size $X_0 \times Y_0$=100×100 nm in the middle of the respective feature 144. In FIG. 4, the symbols $X_1, Y_1$ denote the respective minimal distances, in the X and Y directions, between a cutout 410 and the outer boundary of feature 144. In the present example, $X_1$=(250−100)/2=75 nm, and $Y_1$=100 nm. In other embodiments with the same wavelength, X×Y=180×216 nm, the dX and dY dimensions are three times the respective X and Y dimensions, and each cutout 410 is an 80×80 nm square in the middle of a feature 144. Hence, $X_1$=50 nm, $Y_1$=68 nm. Other dimensions are used in other embodiments.

Figure 6:
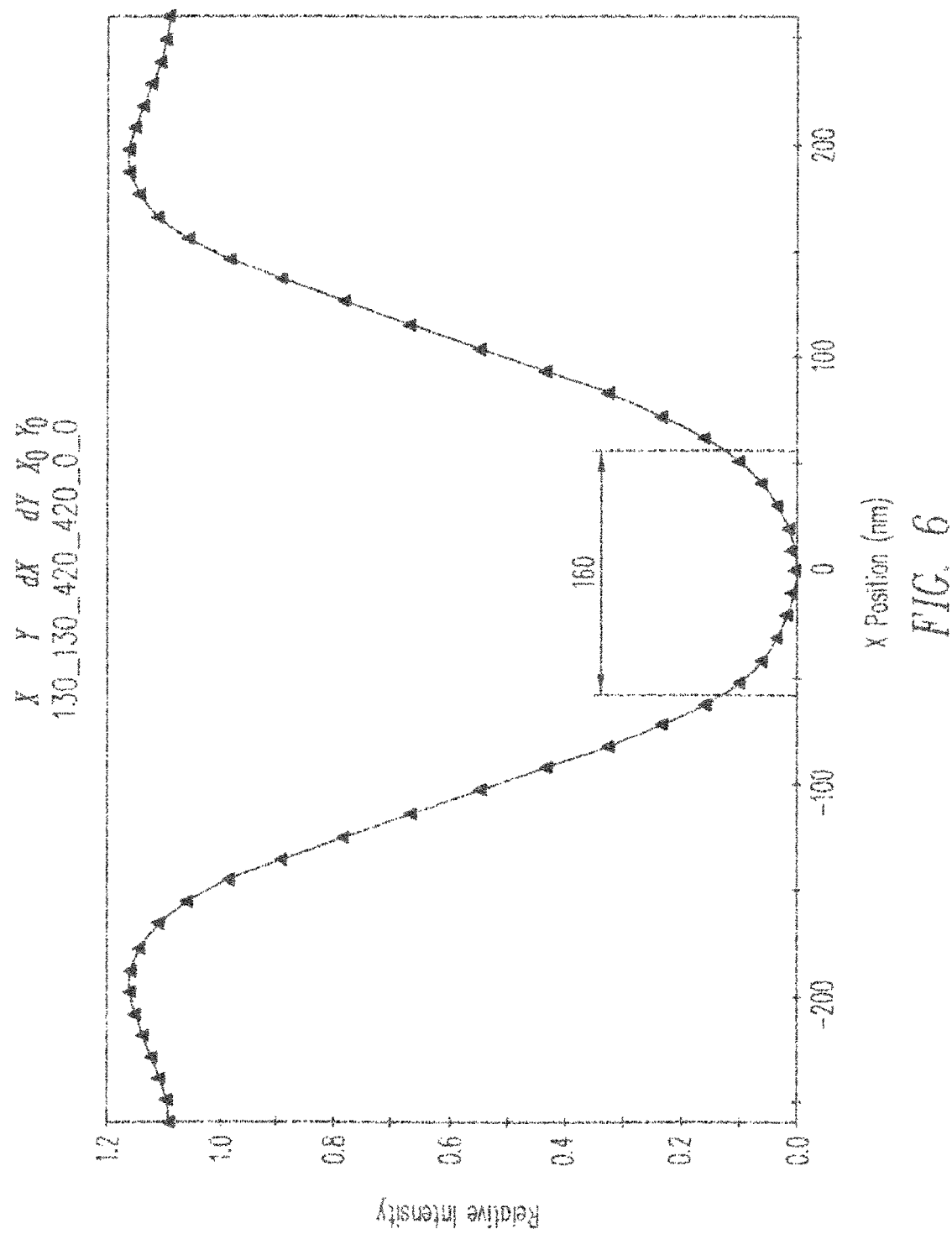

FIGS. 6-14 illustrate light intensity profiles obtained by simulation for the wavelength of 193 nm for different combinations of dimensions X, Y, dX, dY, $X_0, Y_0$ as indicated in Table 1 below for an array of features 144. Each cutout was assumed centered at the center of the respective feature 144. The dimensions are shown in nanometers. The light intensity is shown at different positions in a cross section passing through the middle of a resist area 160. FIG. 6 was obtained without a cutout 410 (as indicated by the zero values for $X_0$ and $Y_0$), but there was no intensity peak inside the area 160. This is believed to be due to the small size of features 144 (130×130 nm for the wavelength of 193 nm). FIGS. 7-10 illustrate the reduction of the intensity peak inside the area 160 for X=Y=180 nm as the cutout size $X_0 \times Y_0$ increases from 0×0 (no cutout) to 80×80 nm (no peak inside area 160).

Figure 11:
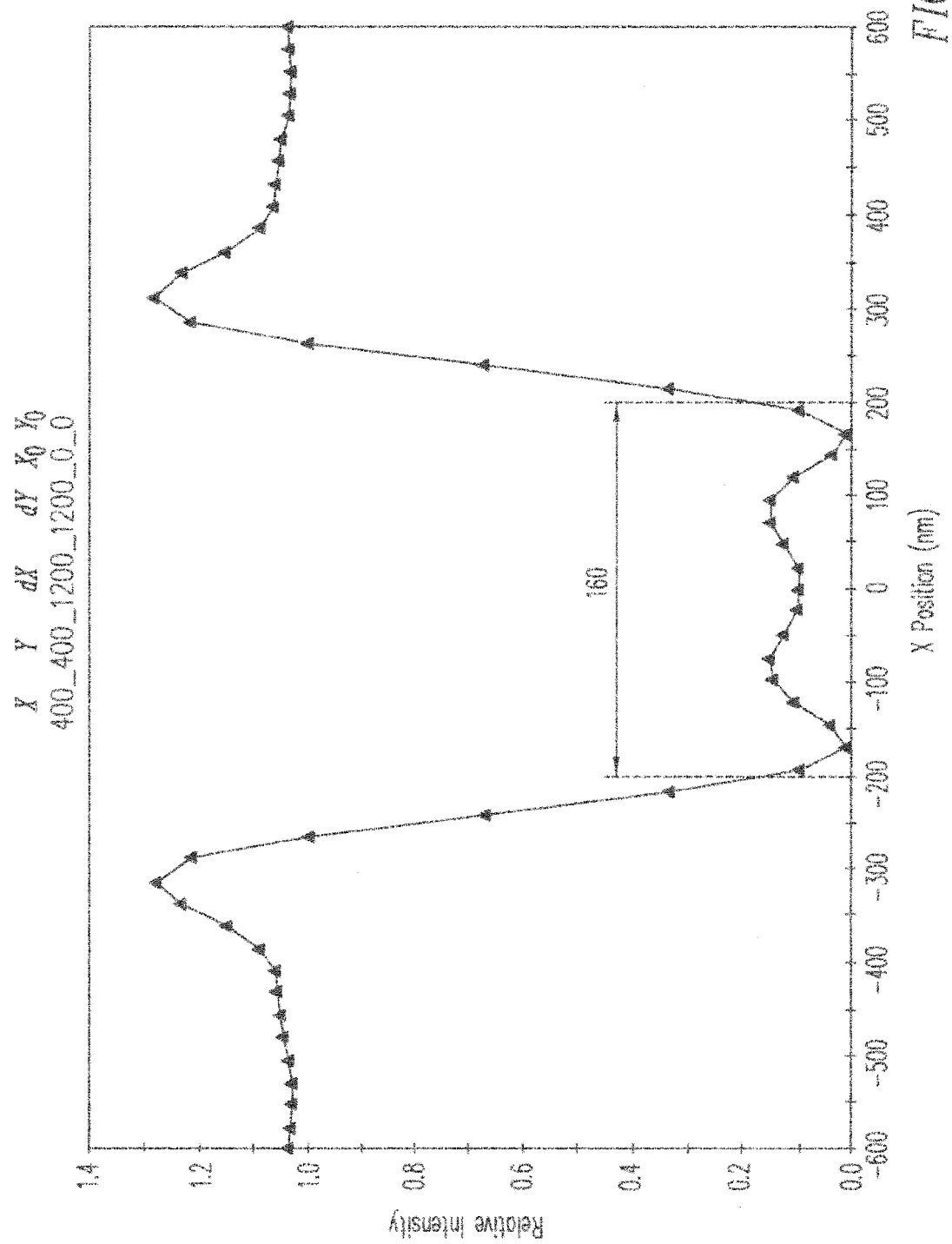

In FIG. 11, X×Y=400×400 nm, and the interior of the area 160 includes two peaks on the opposite sides of the center of area 160. The two peaks may be part of a single three-dimensional peak laterally surrounding the center of area 160. The intensity inside area 160 is reduced by providing an 80×80 nm cutout 410 as shown in FIG. 12.

Figure 13:
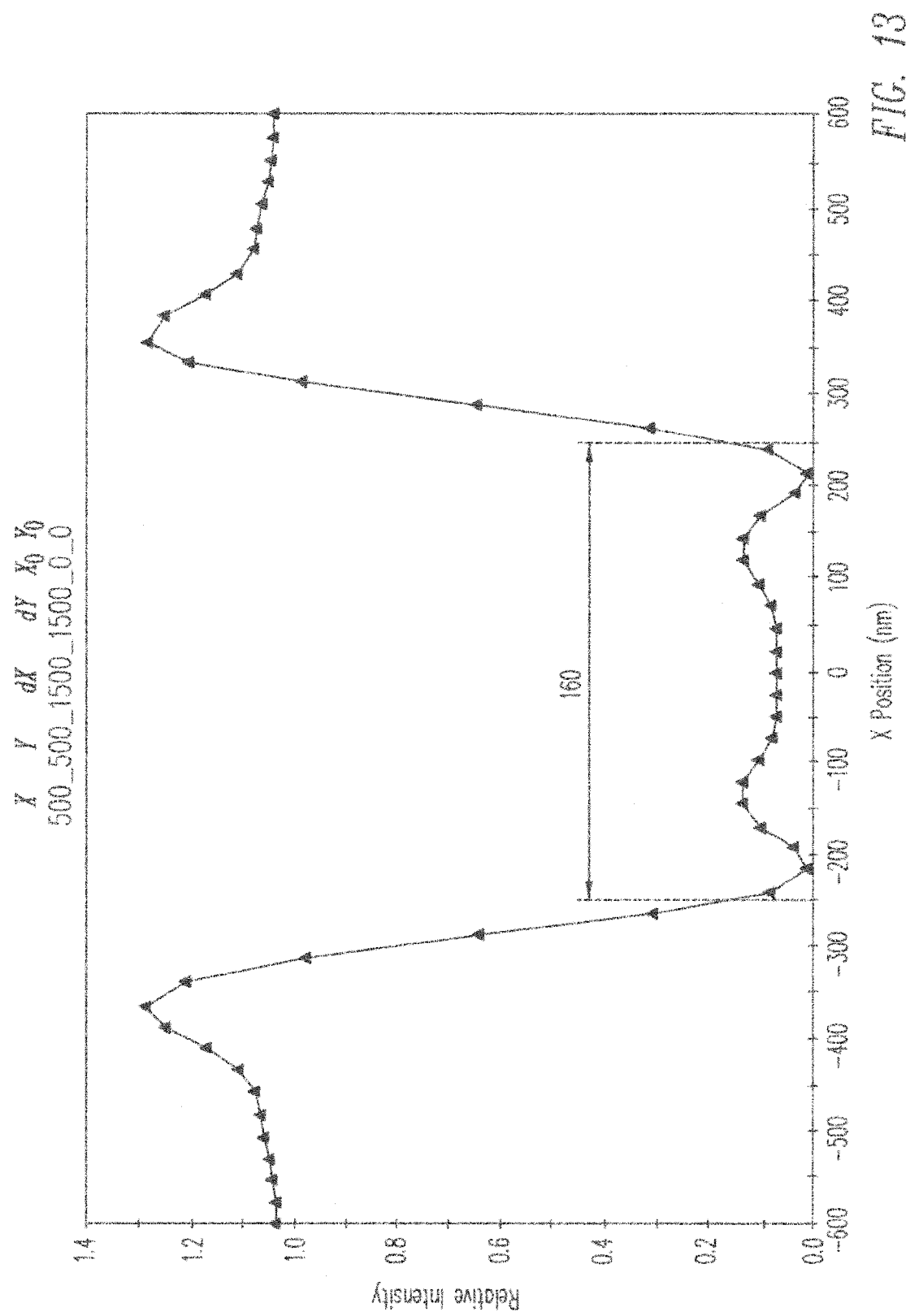
Figure 14:
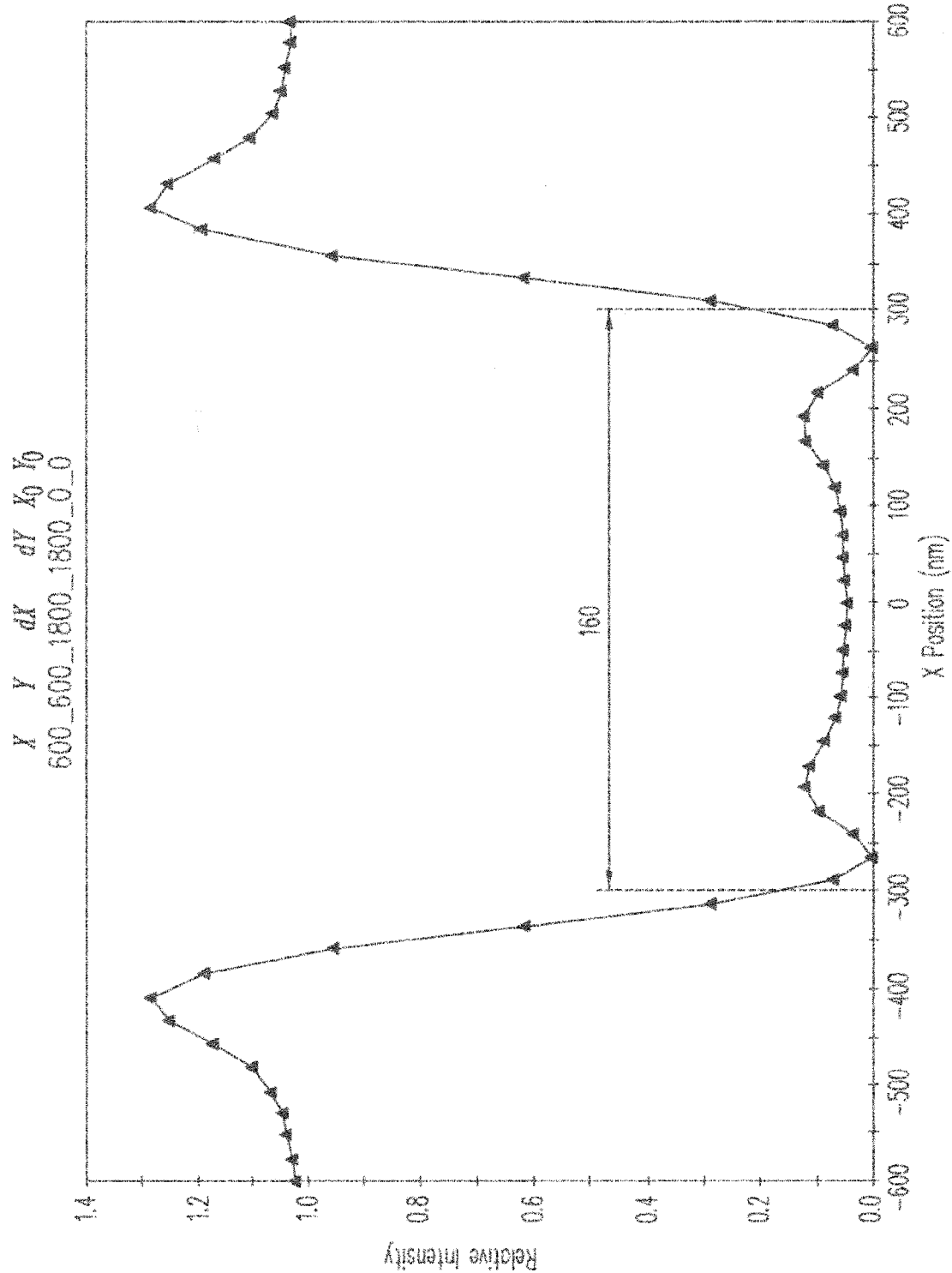

FIGS. 13, 14 show a similar two-peak profile for still larger features 144 when no cutout 410 is provided.

TABLE 1

Figure 7:
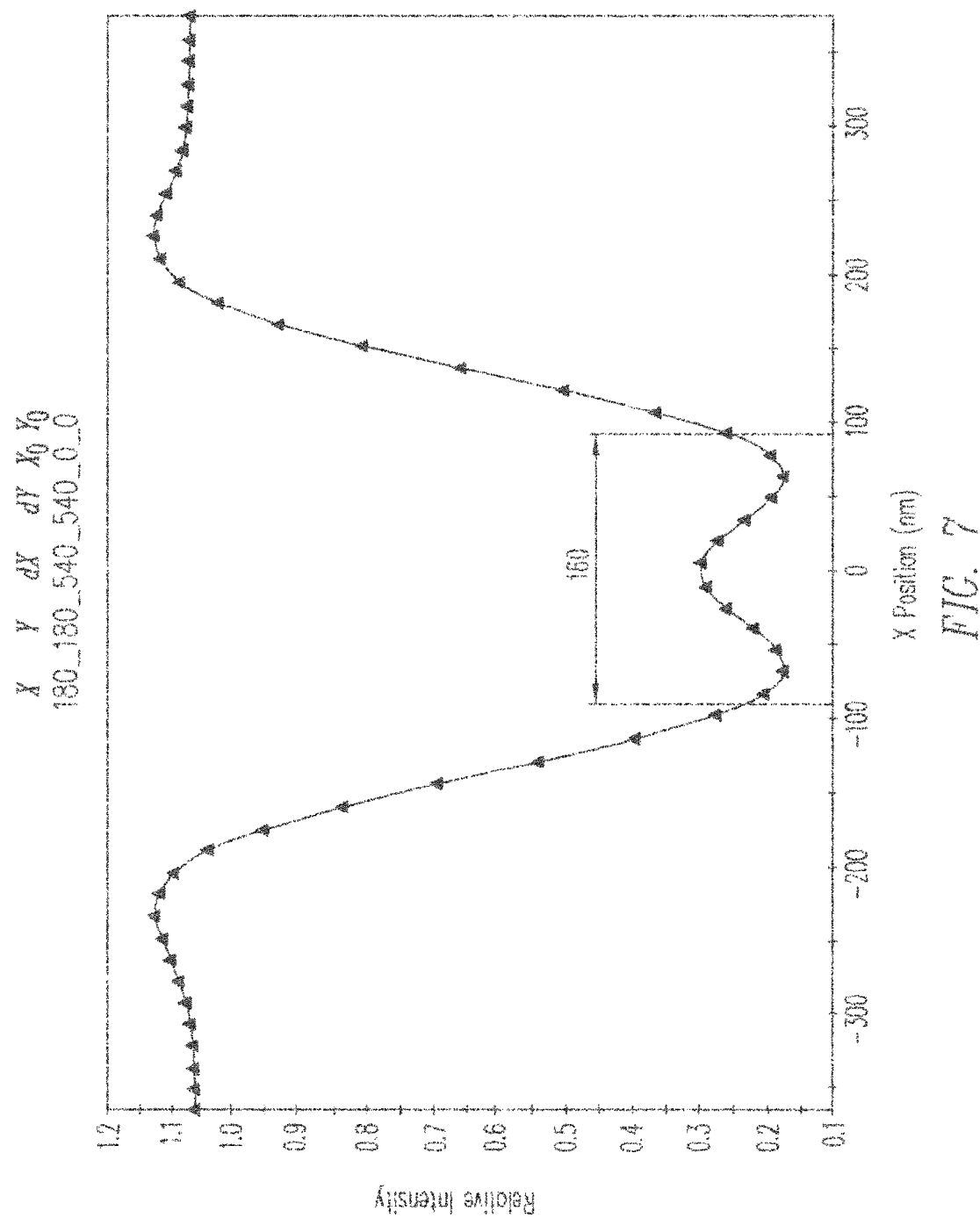
Figure 8:
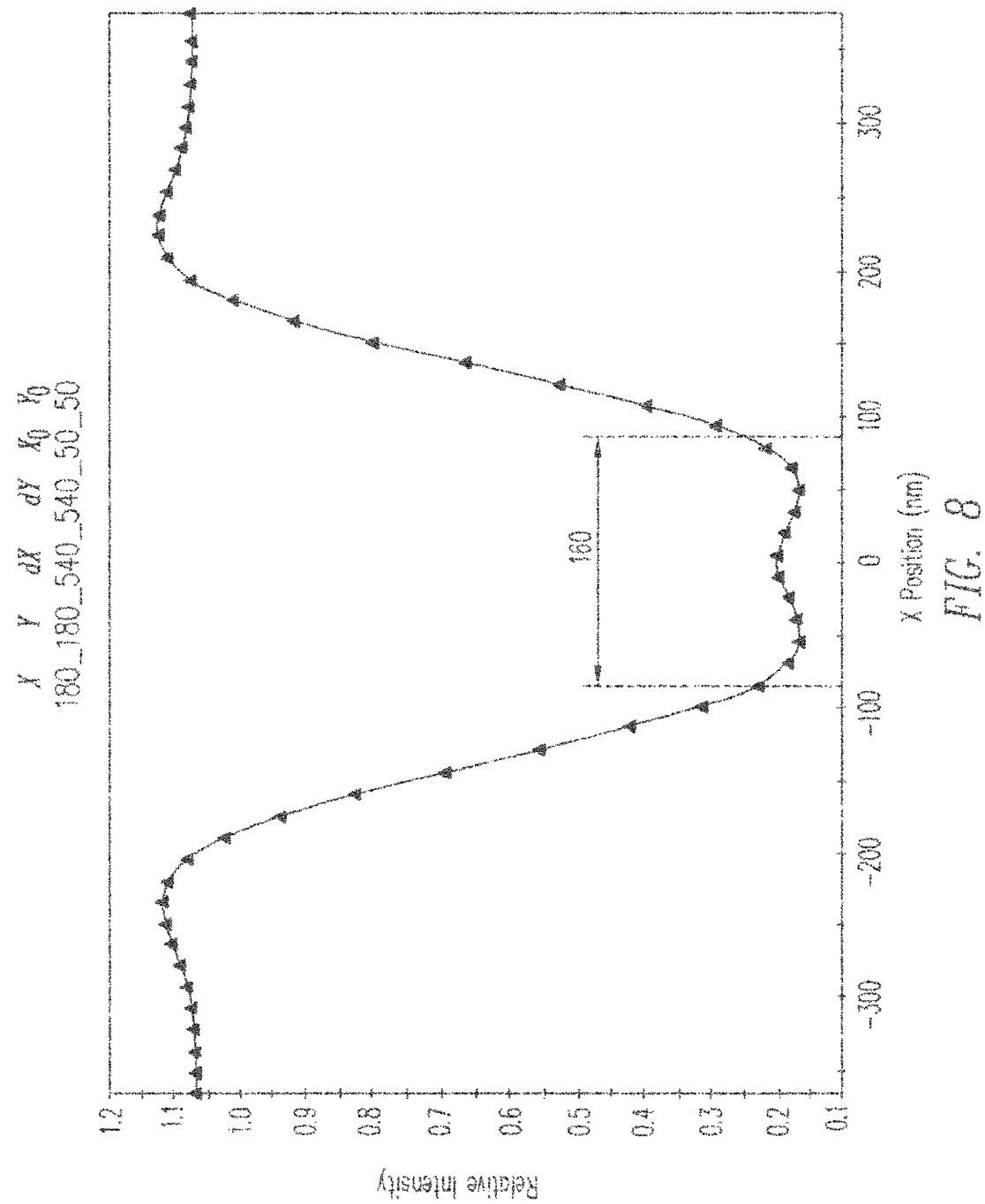
Figure 9:
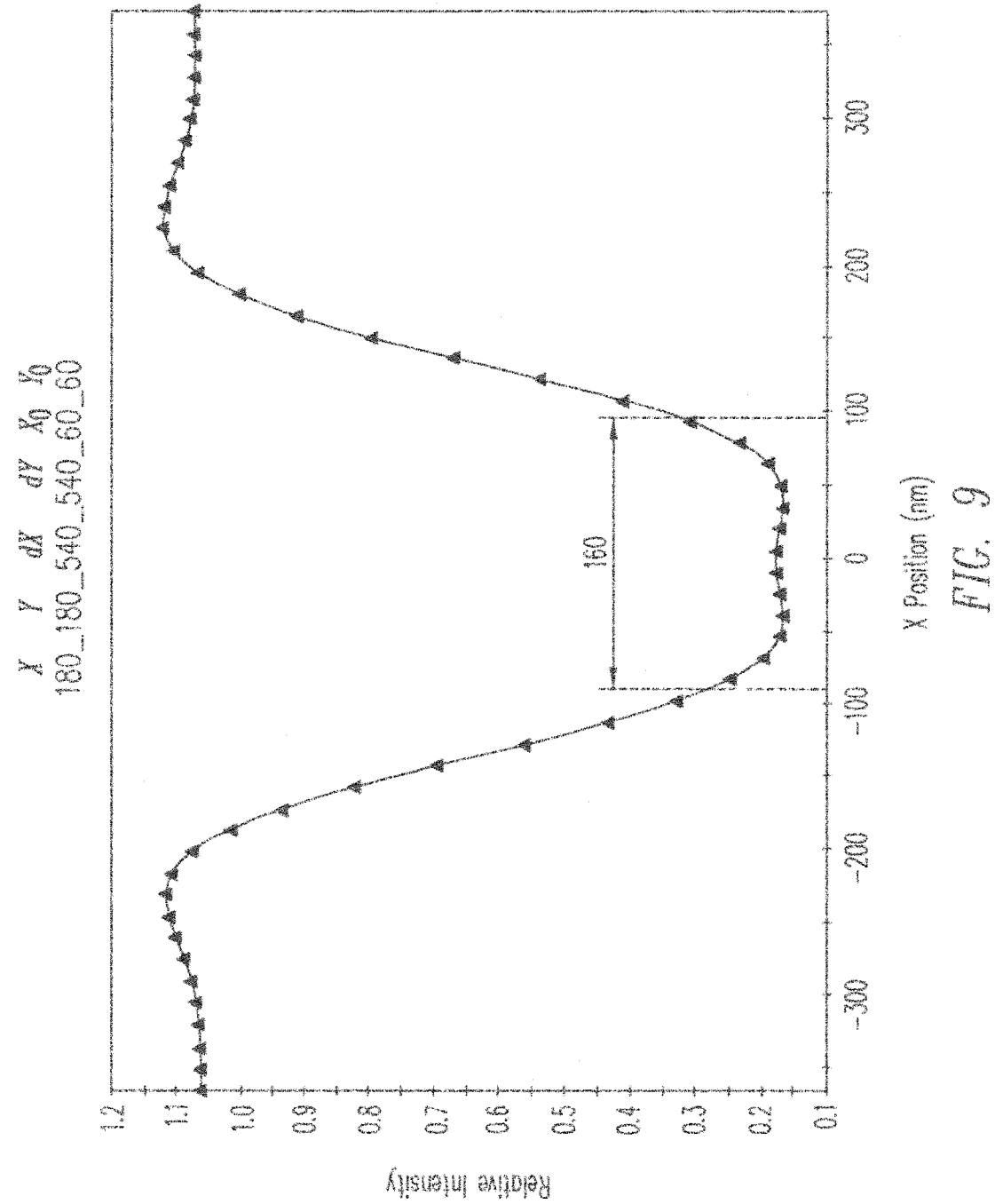
Figure 10:
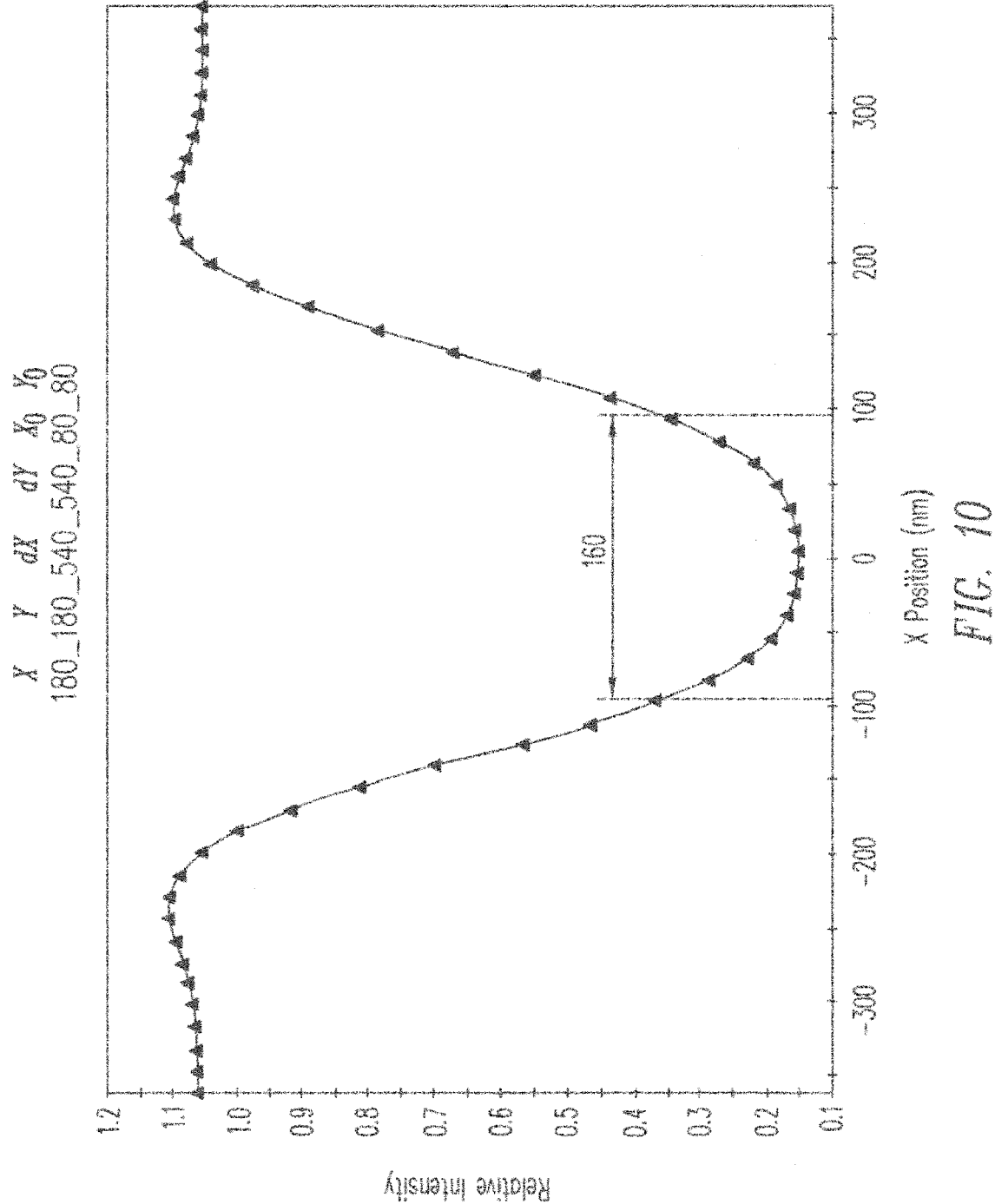
Figure 12:
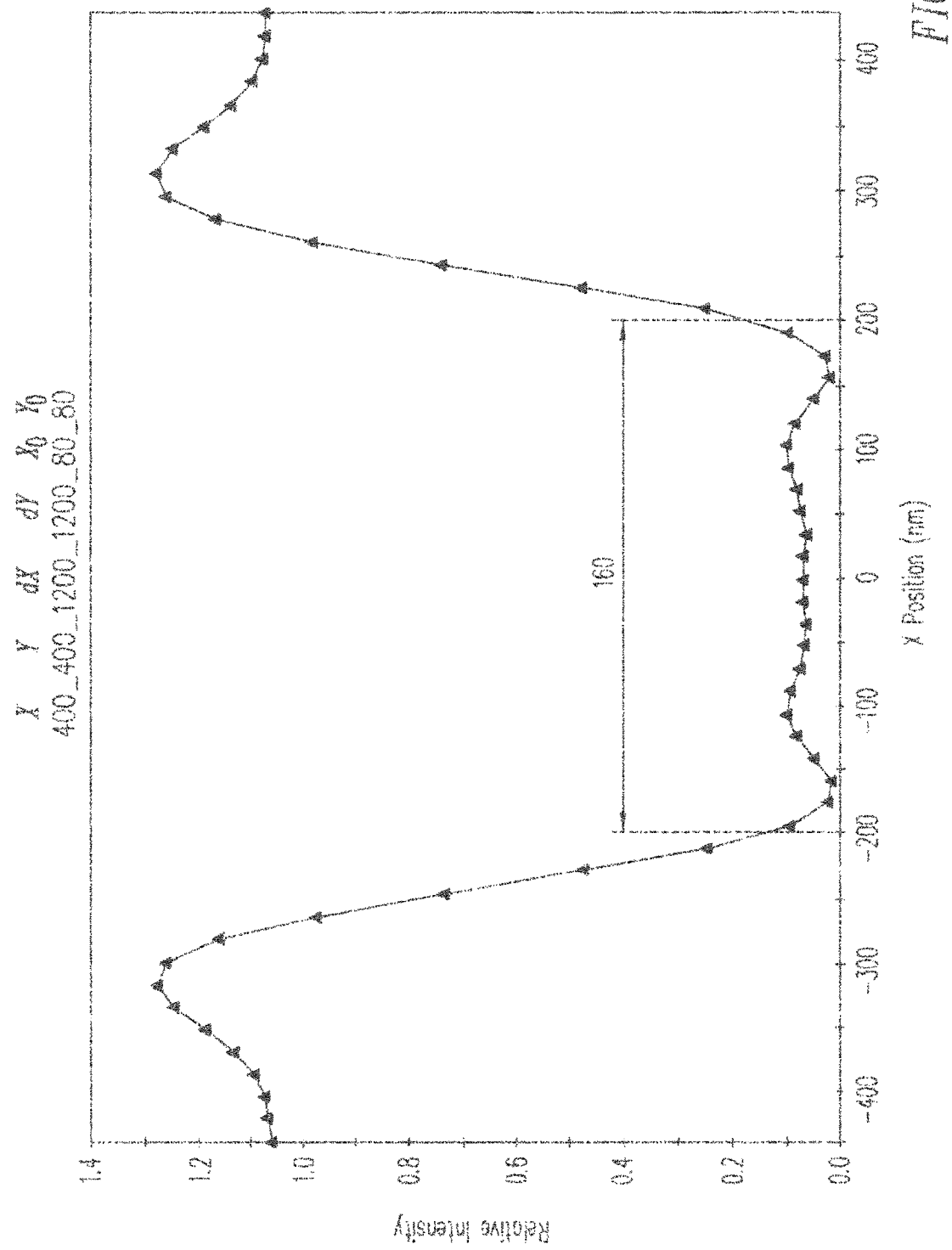

|  | X | Y | dX | dY | $X_0$ | $Y_0$ |
| --- | --- | --- | --- | --- | --- | --- |
| FIG. 6 | 130 | 130 | 420 | 420 | 0 | 0 |
| FIG. 7 | 180 | 180 | 540 | 540 | 0 | 0 |
| FIG. 8 | 180 | 180 | 540 | 540 | 50 | 50 |
| FIG. 9 | 180 | 180 | 540 | 540 | 60 | 60 |
| FIG. 10 | 180 | 180 | 540 | 540 | 80 | 80 |
| FIG. 11 | 400 | 400 | 1200 | 1200 | 0 | 0 |
| FIG. 12 | 400 | 400 | 1200 | 1200 | 80 | 80 |
| FIG. 13 | 500 | 500 | 1500 | 1500 | 0 | 0 |
| FIG. 14 | 600 | 600 | 1800 | 1800 | 0 | 0 |

For the two-peak case of FIGS. 11-14 it may be particularly beneficial to provide multiple cutouts 410 at the periphery of a feature 144. Multiple cutouts at the periphery can also be provided for features 144 sized as in FIGS. 6-10. Both in the case of a single cutout and multiple cutouts, it is presently believed that effective reduction of light intensity in areas 160 can be obtained if each of $X_0, Y_0, dX_0, dY_0, X_1, Y_1$ is in the range of 0.25λ to 0.6λ.

The discussion immediately below provides exemplary geometry of cutouts 410 for certain ranges of X and Y. This discussion does not limit the invention. The geometry most appropriate for each case depends not only on the mask dimensions but on other factors including, for example, the type of processing after the photoresist is developed. Some types of processing may be more tolerant to the resist erosion in area 164. Other pertinent factors may include the photoresist and developer composition and other parameters which may or may not be understood at this time.

Suppose first that each of X and Y is at most 0.75λ (as in FIG. 6; if λ=193 nm, then 0.75λ=144.75 nm). In this case, no cutout may be needed.

If one or both of X and Y is above 0.75λ but both of X and Y are at most 1.5) (289.5 nm if λ=193 nm), then a single cutout 410 in the middle of feature 410 can be appropriate. See FIGS. 7-10.

Figure 15:
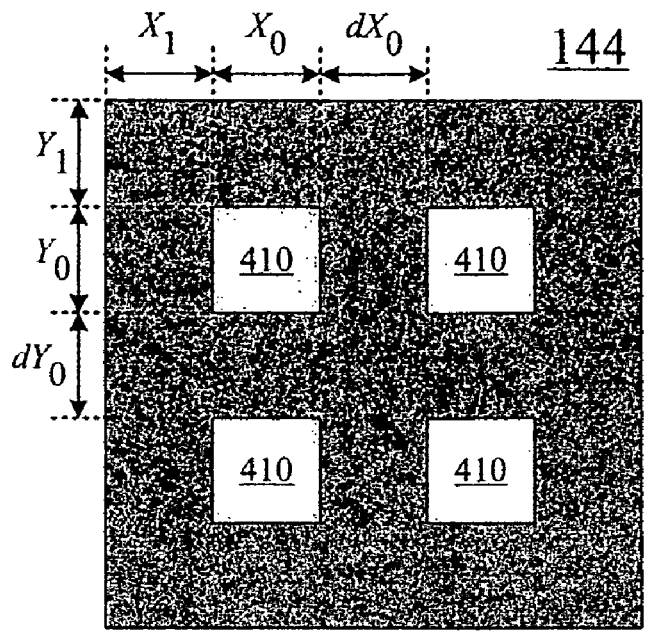
FIGS. 15-17 are plan views of optical masks according to some embodiments of the present invention.

If one or both of X and Y is at least 1.25λ (241.25 nm for λ=193 nm), then a two-peak profile can be present as in FIG. 11. A single cutout can be provided. FIG. 15 shows four cutouts 410 in a single feature 144. The cutouts are symmetrically arranged and are of equal sizes, but this is not necessary. In some embodiments, each of $X_0, Y_0, dX_0, dY_0, X_1, Y_1$ is in the range from 0.25λ to 0.6λ inclusive. These dimensions may or may not be different for different cutouts 410. Also, the cutouts do not have to be rectangular, but may be elliptical or of other shapes.

Figure 16:
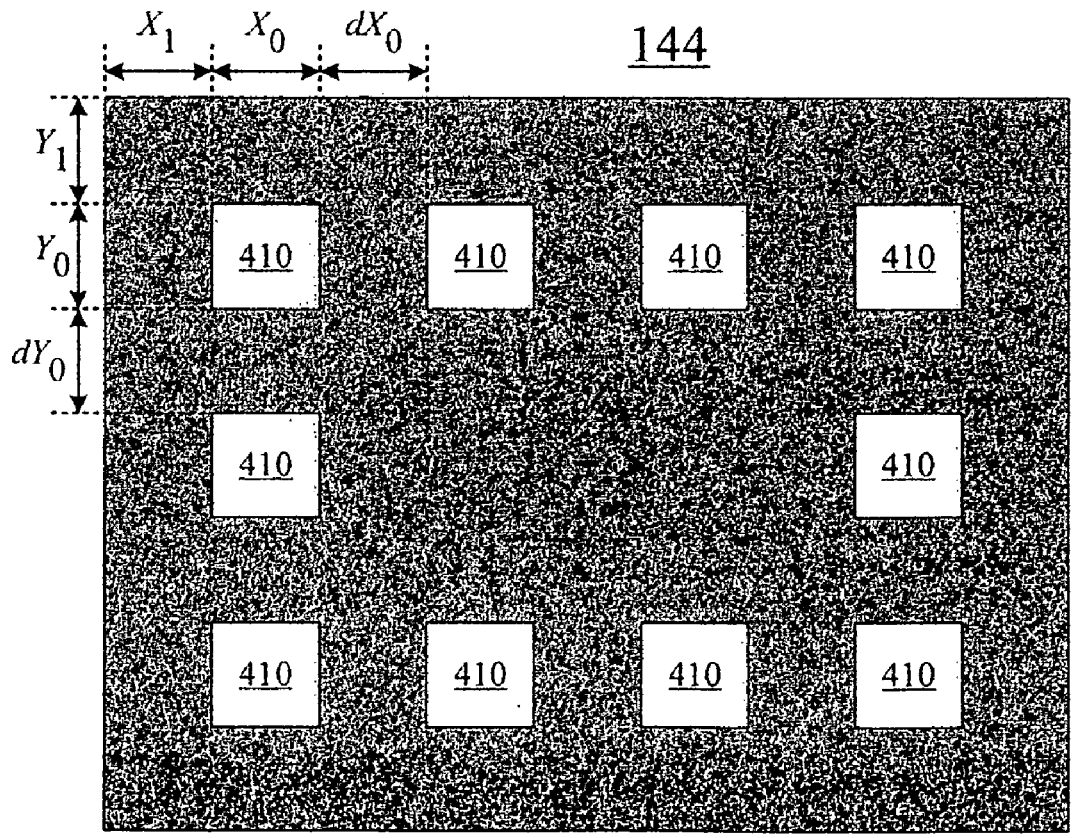
Figure 17:
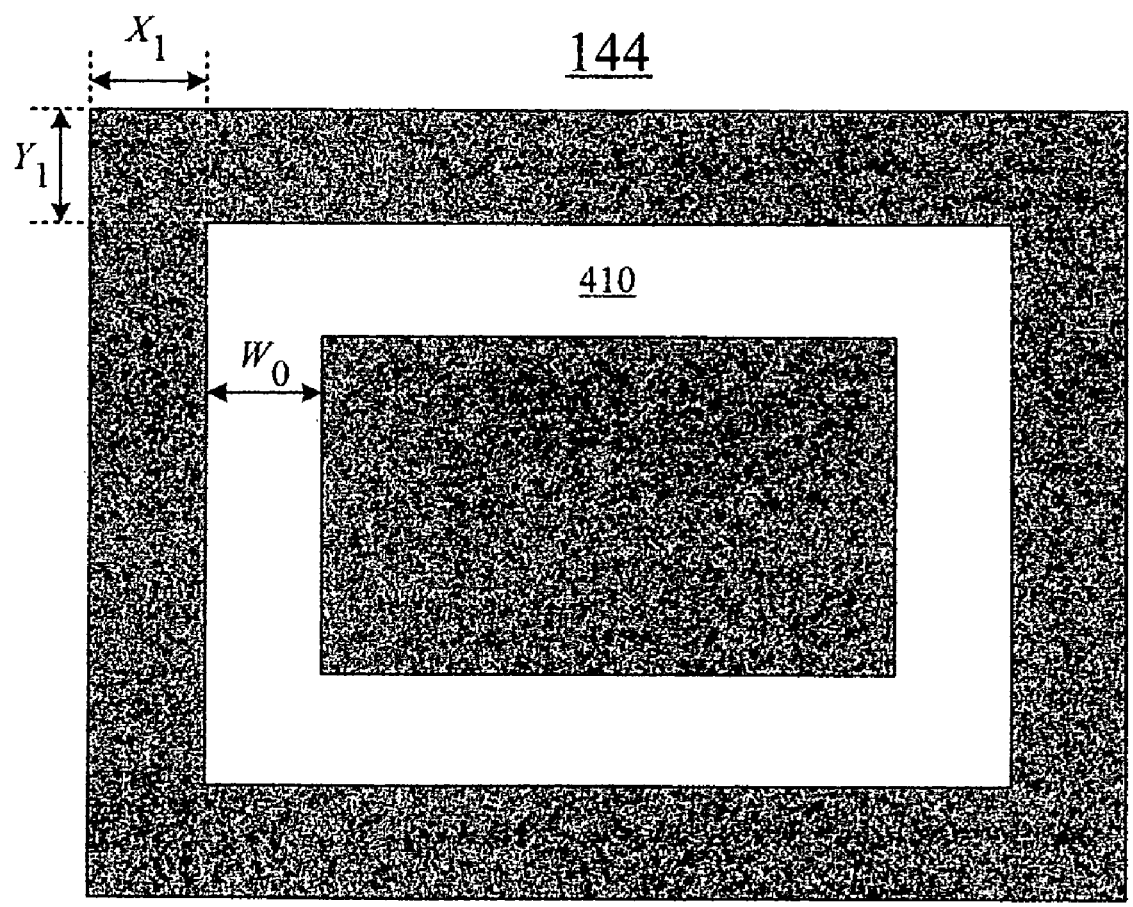

If one or both of X and Y is above 2λ, then the layout of FIG. 16 is believed to be suitable. Here the cutouts are arranged along the periphery of area 144. In some embodiments, each of $X_0, Y_0, dX_0, dY_0, X_1, Y_1$ is in the range from 0.25λ to 0.6λ inclusive. Alternatively, the cutouts can be merged into a single strip 410 (FIG. 17) extending along the periphery of area 144. The strip's width $W_0$ can have any suitable value, and the range of 0.25λ to 0.6λ inclusive is believed to be appropriate. The parameters $X_1, Y_1$ can be as in FIG. 16. In some embodiments, the strip has gaps in it. Strip geometry is also appropriate for the dimensions of FIG. 15 and other dimensions. The embodiments and dimensions discussed above are not limiting. Many variations are possible. For example, additional cutouts can be provided (e.g. in the middle of feature 144 in FIGS. 15-17), and some cutouts can be omitted.

In some embodiments, a cutout may be present even when it does not serve to reduce the light intensity in area 160. Indeed, a cutout can be provided without investigating if a cutout is useful, when it is believed that a cutout would not hurt (would not be printed).

Without limiting the invention to any particular theory, it is believed that the areas 160 are darkened by the cutouts because the light passing through the cutouts destructively interferes, in the interior of photoresist areas 160, with the light passing through clear features 148 surrounding the features 144. If this is so, then darkening the areas 160 with the cutouts 410 of the same vertical optical pathlength as the clear features 148 is an unexpected result in view of the aforementioned U.S. Pat. No. 7,172,840, which proposes cutouts having a different optical pathlength to provide an 180° phase shift with respect to the clear surrounding features.

The invention is not limited to the embodiments described above, and in particular to a specific exposure system, wavelength, or photoresist type. The photoresist can be positive or negative, and can be any suitable photosensitive material (e.g. polyimide) which may or may not remain in the final structure (e.g. integrated circuit) manufactured in the wafer. The invention is not limited to a particular shape of a feature 144 or a cutout 410. Thus, the features 144 may be circular, elliptic, triangular, or perhaps other shapes. The cutouts 410 can also be of different shapes. Different shapes and dimensions can be combined in a single mask.

Some embodiments provide a method for forming an illumination pattern on a photosensitive material to print the illumination pattern in the photosensitive material when the photosensitive material is later developed, the illumination pattern being formed by light comprising a wavelength λ to which the photosensitive material is sensitive, the illumination pattern being a pattern of one or more light areas and one or more dark areas, each light area being illuminated with greater intensity of said light than each dark area. In some embodiments, the contrast between the light and dark areas is sufficient to print the illumination pattern. The method comprises: obtaining an optical mask comprising a pattern of one or more first features (e.g. opaque features) and a plurality of second features (e.g. clear features), each first feature being less transparent to said light than each second feature. For example, a first feature may be the opaque edge of feature 144. The second features may be 148 or 410. According to the method, each first feature surrounds one or more of said second features (e.g. the opaque edge of feature 144 surrounds one or more cutouts 410), and each first feature borders on, and is surrounded by, one of said second features (e.g. 148). The method further comprises forming said illumination pattern by illuminating the photosensitive material with said light through the optical mask to project the optical mask onto the photosensitive material; wherein for each said first feature, the optical mask has the same optical pathlength outside the first feature adjacent to an entire outer boundary of the first feature as at the one or more second features surrounded by the first feature, the optical pathlength being measured along the optical mask's thickness; for each said first feature surrounding one or more second features, the first feature and the one or more second features are projected onto one of said one or more dark areas (e.g. each feature 144 with a cutout 410 is projected onto a dark area 160); and wherein at least one of the following conditions (A) and (B) is true: (A) for at least one said first feature, the first feature is spaced by at least one third of the wavelength λ from any other feature less transparent than the second features and located outside of the first feature (e.g. the distances $X_1, Y_1$ may each be at least λ/3); (B) for at least one said second feature surrounded by a first feature, the second feature has a length and a width each of which is at least 0.25λ (e.g. each of $X_0, Y_0$ can be at least 0.25λ).

In some embodiments, the second feature's length and width are each at most 0.6λ (e.g. each of $X_0, Y_0$ can be at most 0.6λ).

In some embodiments, each said first feature has a width and a length each of which is at least 0.75 of said wavelength λ (e.g. each of X, Y can be at least 0.75λ).

In some embodiments, each said second feature surrounded by a first feature is spaced by at most 0.6λ from the first feature's outer boundary (e.g. each of $X_1, Y_1$ is at most 0.6λ).

In some embodiments, each said first feature's length and/or width is at least 1.25λ, and each second feature surrounded by the first feature has a width of at most 0.6% (e.g. at least one of $X_0, Y_0, W_0$ is at most 0.6λ).

In some embodiments, said light is coherent or partially coherent.

In some embodiments, the one or more second features surrounded by the first feature serve to reduce an intensity of said light inside the photosensitive material's area (e.g. 160) onto which the first feature is projected.

Some embodiments provide suitable optical masks.

Other embodiments and variations are within the scope of the invention, as defined by the appended claims.

The invention claimed is:

1. A method for forming an illumination pattern on a photosensitive material to print the illumination pattern in the photosensitive material when the photosensitive material is later developed, the illumination pattern being formed by light comprising a wavelength λ to which the photosensitive material is sensitive, the illumination pattern being a pattern of one or more light areas and one or more dark areas, each light area being illuminated with greater intensity of said light than each dark area, the method comprising:

obtaining an optical mask comprising a pattern of one or more first features and a plurality of second features, each first feature being less transparent to said light than each second feature, wherein each first feature surrounds one or more of said second features and borders on, and is surrounded by, one of said second features; and forming said illumination pattern by illuminating the photosensitive material with said light through the optical mask to project the optical mask onto the photosensitive material;

wherein for each said first feature, the optical mask has the same optical pathlength outside the first feature adjacent to an entire outer boundary of the first feature as at the one or more second features surrounded by the first feature, the optical pathlength being measured along the optical mask's thickness;

for each said first feature surrounding one or more second features, the first feature and the one or more second features are projected onto one of said one or more dark areas; and wherein at least one of the following conditions (A) and (B) is true:

(A) for at least one said first feature, the first feature is spaced by at least one third of the wavelength $\lambda$ from any other feature less transparent than the second features and located outside of the first feature;

(B) for at least one said second feature surrounded by a first feature, the second feature has a length and a width each of which is at least $0.25\lambda$.

2. The method of claim 1 wherein the condition (A) is true.

3. The method of claim 2 wherein the one or more first features form an array in which adjacent first features are at a distance of at least one third of the wavelength $\lambda$ from each other.

4. The method of claim 1 wherein the condition (B) is true.

5. The method of claim 4 wherein for each second feature surrounded by a first feature, the second feature's length and width are each at most $0.6\lambda$.

6. The method of claim 1 wherein both conditions (A) and (B) are true.

7. The method of claim 1 wherein each said first feature has a width and a length each of which is at least 0.75 of said wavelength B.

8. The method of claim 1 wherein each said second feature surrounded by a first feature is spaced by at most 0.6% from the first feature's outer boundary.

9. The method of claim 8 wherein each said first feature's length and/or width is at least $1.25\lambda$, and each second feature surrounded by the first feature has a width of at most $0.6\lambda$.

10. The method of claim 9 wherein each said first feature's length and width is at least $1.5\lambda$.

11. The method of claim 1 wherein the optical mask comprises a substrate transparent to said light and having a uniform composition and thickness, with each first feature being provided by a material on said substrate and each second feature being formed by the substrate's portion not covered by the material.

12. The method of claim 1 further comprising, after forming the illumination pattern, developing the photosensitive material to form a pattern in the photosensitive material.

13. The method of claim 1 wherein said light is coherent or partially coherent.

14. A method for forming an illumination pattern on a photosensitive material, the illumination pattern being formed by light comprising a wavelength $\lambda$ to which the photosensitive material is sensitive, the method comprising:

obtaining an optical mask comprising a pattern of one or more first features and a plurality of second features, each first feature being less transparent to said light than each second feature, wherein each first feature surrounds at least one said second feature and borders on, and is surrounded by, one of said second features; and forming said illumination pattern by illuminating the photosensitive material with said light through the optical mask to project the optical mask onto the photosensitive material;

wherein for each said first feature, the optical mask has the same optical pathlength outside the first feature adjacent to an entire outer boundary of the first feature as at the one or more second features surrounded by the first feature, the optical pathlength being measured along the optical mask's thickness;

for each said first feature surrounding one or more second features and projected into one of said dark areas, the one or more second features surrounded by the first feature serve to reduce an intensity of said light inside the photosensitive material's area onto which the first feature is projected.

15. The method of claim 14 wherein the optical mask comprises a substrate transparent to said light and having a uniform composition and thickness, with each first feature being provided by a material on said substrate and each second feature being formed by the substrate's portion not covered by the material.

16. The method of claim 14 further comprising, after forming the illumination pattern, developing the photosensitive material to form a pattern in the photosensitive material.

17. The method of claim 14 wherein each said second feature surrounded by a first feature fits into a rectangle whose length and width are each at most $0.6\lambda$.

18. The method of claim 17 wherein the length and width are each at least $0.25\lambda$.

19. The method of claim 18 wherein each said second feature surrounded by a first feature is spaced by at most $0.6\lambda$ from the first feature's outer boundary.

20. The method of claim 19 wherein each said second feature surrounded by a first feature is spaced by at least $0.25\lambda$ from the first feature's outer boundary.

21. The method of claim 19 wherein the one or more first features form an array in which adjacent first features are at a distance of at least one third of the wavelength $\lambda$ from each other.

22. An optical mask for use in a photolithographic exposure system of projection type with light of a wavelength $\lambda$, the optical mask comprising a pattern of one more first features and a plurality of second features, each first feature being less transparent to said light than each second feature, wherein each first feature surrounds at least one said second feature and borders on, and is surrounded by, one of said second features;

wherein for each said first feature, the optical mask has the same optical pathlength outside the first feature adjacent to an entire outer boundary of the first feature as at the one or more second features surrounded by the first feature, the optical pathlength being measured along the optical mask's thickness;

for each said first feature surrounding one or more second features and projected into one of said dark areas, the one or more second features surrounded by the first feature serve to reduce an intensity of said light inside the photosensitive material's area onto which the first feature is projected.

23. The optical mask of claim 22 wherein the optical mask comprises a substrate transparent to said light and having a uniform composition and thickness, with each first feature being provided by a material on said substrate and each second feature being formed by the substrate's portion not covered by the material.

24. The optical mask of claim 22 wherein each first feature fits into a respective rectangle of a size $2\lambda \times 2\lambda$.

25. The optical mask of claim 22 wherein each first feature has a width and a length each if which is at least $0.75\lambda$.

26. The method of claim 22 wherein each said second feature surrounded by a first feature is spaced by at most $0.6\lambda$ from the first feature's outer boundary.

27. The method of claim 26 wherein each said first feature's length and/or width is at least $1.25\lambda$, and each second feature surrounded by the first feature has a width of at most $0.6\lambda$.

28. The method of claim 27 wherein each said first feature's length and width is at least $1.5\lambda$.

29. The optical mask of claim 22 wherein the optical mask's pattern comprises an array of the first features, the array having a plurality of rows and a plurality of columns, wherein a distance between any adjacent ones of the first features is at least one third of the wavelength $\lambda$.

\* \* \* \* \*